United States Patent
Lemon et al.

(10) Patent No.: US 11,888,050 B2
(45) Date of Patent: Jan. 30, 2024

(54) LATERAL BIPOLAR TRANSISTOR STRUCTURE WITH INNER AND OUTER SPACERS AND METHODS TO FORM SAME

(71) Applicant: GlobalFoundries U.S. Inc., Malta, NY (US)

(72) Inventors: John L. Lemon, Selkirk, NY (US); Alexander M. Derrickson, Saratoga Springs, NY (US); Haiting Wang, Clifton Park, NY (US); Judson R. Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 93 days.

(21) Appl. No.: 17/457,325

(22) Filed: Dec. 2, 2021

(65) Prior Publication Data

US 2023/0083044 A1    Mar. 16, 2023

Related U.S. Application Data

(60) Provisional application No. 63/244,488, filed on Sep. 15, 2021, provisional application No. 63/237,826, filed on Aug. 27, 2021.

(51) Int. Cl.
*H01L 29/73*    (2006.01)
*H01L 29/735*   (2006.01)
*H01L 29/66*    (2006.01)
*H01L 29/10*    (2006.01)

(52) U.S. Cl.
CPC ........ *H01L 29/735* (2013.01); *H01L 29/1008* (2013.01); *H01L 29/6625* (2013.01)

(58) Field of Classification Search
CPC ............ H01L 29/6625; H01L 29/1008; H01L 29/735
See application file for complete search history.

(56) References Cited

U.S. PATENT DOCUMENTS

| | | | |
|---|---|---|---|
| 6,949,764 B2 | 9/2005 | Ning | |
| 8,288,758 B2 * | 10/2012 | Ning | H01L 29/0808 257/19 |
| 8,420,493 B2 | 4/2013 | Ning et al. | |
| 8,586,441 B1 * | 11/2013 | Cai | H01L 29/161 257/E21.372 |
| 9,105,650 B2 * | 8/2015 | Chang | H01L 29/6625 |
| 10,784,347 B1 * | 9/2020 | Hashemi | H01L 29/735 |
| 10,825,921 B2 | 11/2020 | Balakrishnan et al. | |

(Continued)

*Primary Examiner* — Jay C Chang
*Assistant Examiner* — Siangluai Mang
(74) *Attorney, Agent, or Firm* — Francois Pagette; Hoffman Warnick LLC

(57) ABSTRACT

Embodiments of the disclosure provide a lateral bipolar transistor structure with inner and outer spacers, and related methods. A lateral bipolar transistor structure may have an emitter/collector (E/C) layer over an insulator. The E/C layer has a first doping type. A first base layer is on the insulator and adjacent the E/C layer. The first base layer has a second doping type opposite the first doping type. A second base layer is on the first base layer and having the second doping type. A dopant concentration of the second base layer is greater than a dopant concentration of the first base layer. An inner spacer is on the E/C layer and adjacent the second base layer. An outer spacer is on the E/C layer and adjacent the inner spacer.

20 Claims, 15 Drawing Sheets

(56) References Cited

U.S. PATENT DOCUMENTS

| | | | |
|---|---|---|---|
| 2012/0289018 A1* | 11/2012 | Ning | H01L 29/66265 |
| | | | 257/E21.371 |
| 2013/0313614 A1* | 11/2013 | Fu | H01L 29/66318 |
| | | | 438/320 |
| 2016/0087068 A1* | 3/2016 | Cai | H01L 29/7317 |
| | | | 257/526 |
| 2016/0300935 A1* | 10/2016 | Cai | H01L 29/0821 |
| 2017/0092749 A1* | 3/2017 | Cai | H01L 29/737 |
| 2018/0083127 A1* | 3/2018 | Hashemi | H01L 29/165 |

* cited by examiner

LATERAL BIPOLAR TRANSISTOR STRUCTURE WITH INNER AND OUTER SPACERS AND METHODS TO FORM SAME

BACKGROUND

The present disclosure relates to bipolar transistors. Present technology is at atomic level scaling of certain microdevices such as logic gates, bipolar transistors, field effect transistors (FETs), and capacitors. Circuit chips with millions of such devices are common. The structure of a bipolar transistor defines several of its properties during operation. Conventional integrated circuits may employ vertical bipolar transistors or other types of bipolar transistors, but these types of devices may have higher costs, and/or operational parameters that do not meet certain requirements. Improving the electrical behavior of a bipolar transistor may provide related improvements in a device.

SUMMARY

The illustrative aspects of the present disclosure are designed to solve the problems herein described and/or other problems not discussed.

Embodiments of the disclosure provide a lateral bipolar transistor structure including: an emitter/collector (E/C) layer over an insulator, the E/C layer having a first doping type; a first base layer on the insulator and adjacent the E/C layer, wherein the first base layer has a second doping type opposite the first doping type; a second base layer on the first base layer and having the second doping type, wherein a dopant concentration of the second base layer is greater than a dopant concentration of the first base layer; an inner spacer on the E/C layer and adjacent the second base layer; and an outer spacer on the E/C layer and adjacent the inner spacer.

Other embodiments of the disclosure provide a lateral bipolar transistor structure including: an emitter/collector (E/C) layer over an insulator, the E/C layer having a first doping type; a first base layer on the insulator and adjacent the E/C layer, wherein the first base layer has a second doping type opposite the first doping type; a second base layer on the first base layer and having the second doping type, wherein a dopant concentration of the second base layer is greater than a dopant concentration of the first base layer, the second base layer including: a lower portion having a first horizontal width relative to the inner spacer, and an upper portion having a second horizontal width relative to the inner spacer greater than the first horizontal width; an inner spacer on the E/C layer and adjacent the second base layer; and an outer spacer on the E/C layer and adjacent the inner spacer.

Additional embodiments of the disclosure provide a method of forming a lateral bipolar transistor structure, the method including: forming an emitter/collector (E/C) layer over an insulator, the E/C layer having a first doping type; forming a first base layer on the insulator and adjacent the E/C layer, wherein the first base layer has a second doping type opposite the first doping type; forming a second base layer on the first base layer and having the second doping type, wherein a dopant concentration of the second base layer is greater than a dopant concentration of the first base layer; forming an inner spacer on the E/C layer and adjacent the second base layer; and forming an outer spacer on the E/C layer and adjacent the inner spacer.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
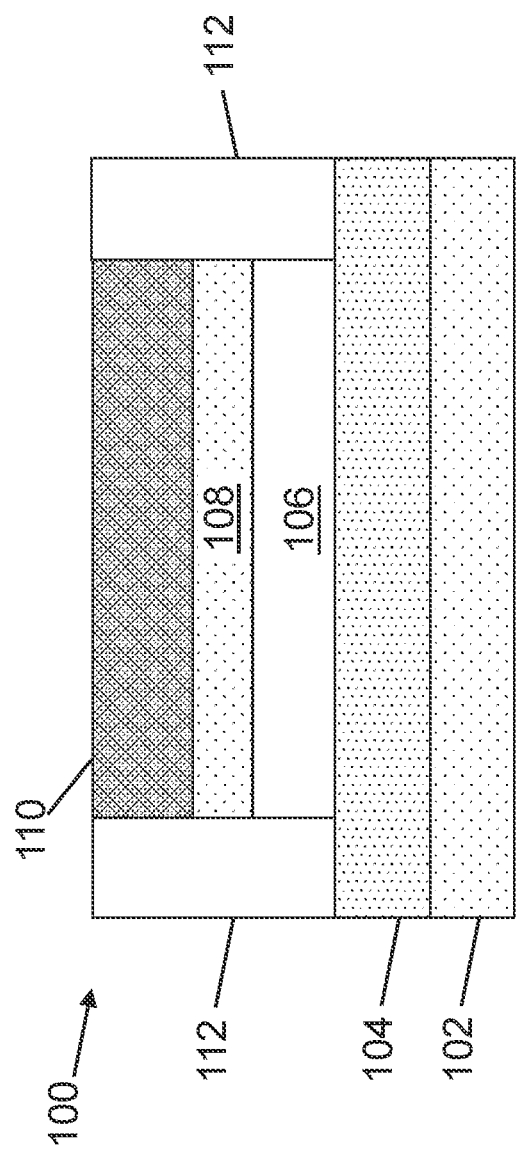
FIG. 1 provides a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a lateral bipolar transistor structure with inner and outer spacers. The lateral bipolar transistor structure may include an emitter/collector (E/C) layer of semiconductor material that is over an insulator. The E/C layer may have a first doping type, e.g., P type or N type. A first base layer, with an opposite doping type from the E/C layer, is on the insulator and adjacent the E/C layer. A second base layer, which has the same doping type as the first base layer, is on the first base layer. The second base layer has a greater dopant concentration than the first base layer, and thus may define an extrinsic base of the lateral bipolar transistor structure. An inner spacer is on the E/C layer and adjacent the second base layer, and an outer spacer is on the E/C layer and adjacent the inner spacer. In this configuration, the first and second base layers may be of a significantly less horizontal width than other types of lateral bipolar transistor structures.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials.

Referring to FIG. 1, a preliminary structure 100 (simply "structure" hereafter) suitable to form a lateral bipolar transistor structure according to embodiments of the disclosure, is shown. Preliminary structure 100 may be processed as described herein to yield one or more lateral bipolar transistor structures. However, it is understood that other techniques, ordering of processes, etc., may be implemented to yield the same bipolar transistor structure(s) or similar bipolar transistor structures in further embodiments. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained. A doped well region 104 may be included on or within substrate 102, e.g., to enable electrical biasing of structures or components formed above substrate 102. Doped well region 104 may have the same dopant type as substrate 102 (e.g., P type doping), but may have a higher dopant concentration therein.

Structure 100 may include embedded elements for electrically separating active materials formed over substrate 102 from other regions and/or materials. An insulator 106 optionally may be formed over doped well region 104 and substrate 102, e.g., by forming a layer of dielectric material (e.g., oxide or nitride insulative material), converting silicon material within substrate 102 or doped well region 104 into a higher-resistive material such as polycrystalline or amorphous silicon (poly-Si), or other techniques.

A semiconductor layer 108 and a doped semiconductor layer 110 may be on insulator 106 and may include any currently known or later developed semiconductor material (e.g., any of those described herein regarding substrate 102). Semiconductor layer 108 and/or doped semiconductor layer 110 may be formed by deposition and/or epitaxial growth of silicon and/or other semiconductor materials on insulator 106 and may have a predetermined doping type, e.g., by being doped in-situ or during formation of doped semiconductor layer 110. In some cases, semiconductor layer 108 may include silicon (e.g., polycrystalline silicon) while doped semiconductor layer 110 may include silicon germanium (SiGe). According to an example, semiconductor layer 108 may be undoped or only lightly doped, while doped semiconductor layer 110 may be more highly doped N type to provide active semiconductor material for use in the base terminal of an eventual lateral bipolar transistor structure.

Insulator 106 may extend horizontally throughout structure 100, and/or may be formed selectively under locations where active materials are formed, examples of which are discussed elsewhere herein. In further implementations, insulator 106 may include oxygen doping to form a dielectric insulator or a buried oxide ("BOX") layer over substrate 102 to electrically isolate semiconductor layer 108 from substrate 102. Insulator 106 thus may include other elements or molecules such as Ge, N, or Si. However embodied, insulator 106 may be sized as narrow as possible to provide better interaction with overlying semiconductor materials (e.g., semiconductor layer 108, doped semiconductor layer 110 and components formed thereon or therefrom). In various embodiments, insulator 106 may have a thickness that is at most approximately twenty-five nanometers (nm) to approximately five-hundred nm. Some portions (not shown) of substrate 102 may not have insulator 106 thereover, and/or multiple layers of insulator 106 may be formed on substrate 102 to varying thicknesses. Additionally, various conductive particles ("dopants") may be introduced into substrate 102 via a process known as "pre-doping" of substrate 102.

Structure 100 (FIG. 1) may include a set of trench isolations (TI(s)) 112. TI(s) 112 may be made by forming and filling trenches (not labeled) with an insulating material such as oxide. TI(s) 112 horizontally isolate insulator 106, semiconductor layer 108, and doped semiconductor layer 110 from any adjacent regions of material. Various portions of a bipolar transistor structure, including the active semiconductor materials thereof and/or other devices where applicable, may be formed on or from portions of insulator 106 and doped semiconductor layer 110 that are isolated by TI(s) 112. According to one example, two TIs 112 are formed, with insulator 106, semiconductor layer 108, and doped semiconductor layer 110 being horizontally between the two TIs 112. TI(s) 112 may be formed before active materials are formed over substrate 102, but this is not necessarily true in all implementations.

Each TI 112 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. TI(s) 112 and doped semiconductor layer 110 may be planarized (e.g., by chemical mechanical planarization or other technique(s)) such that the upper surface(s) thereof is/are substantially coplanar with each other.

Figure 2:
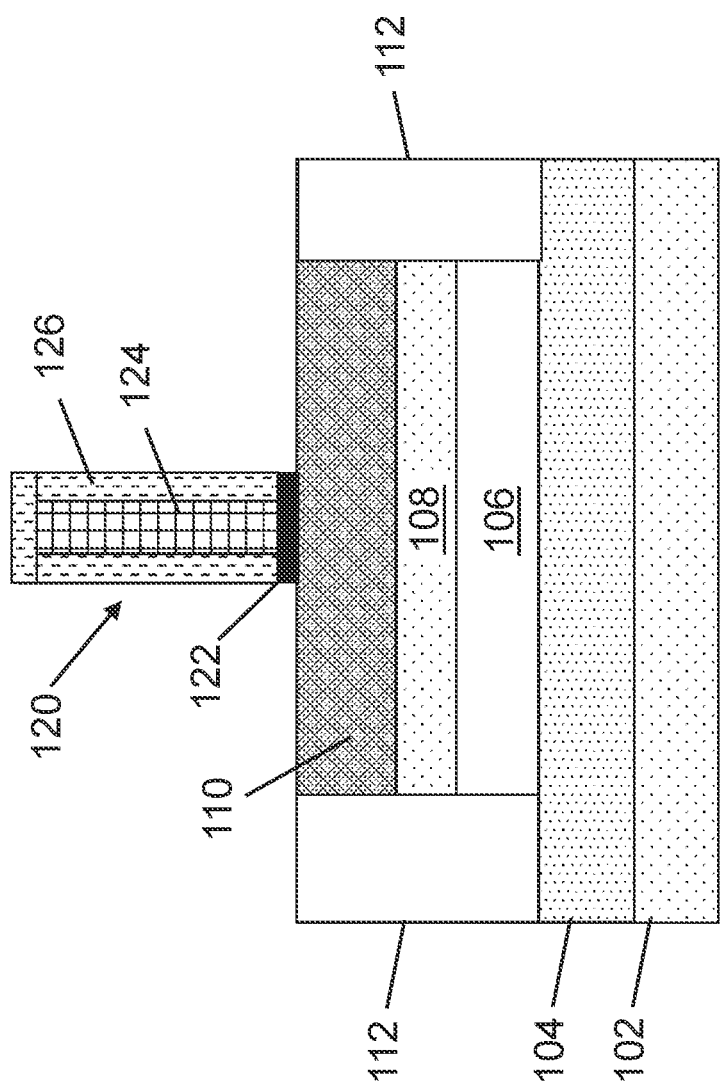
FIG. 2 provides a cross-sectional view of forming a base structure according to embodiments of the disclosure.

FIG. 2 depicts forming a base assembly 120 on doped semiconductor layer 110, e.g., to allow subsequent or independent processing of doped semiconductor layer 110 according to embodiments of the disclosure. The forming of base assembly 120 may include forming an insulative liner 122 on a portion of semiconductor layer 110, and forming a polycrystalline semiconductor 124 (e.g., poly-Si) on insulative liner 122. Polycrystalline semiconductor 124 may not form part of the eventual bipolar transistor structure, and may be formed as a placeholder material within base assembly 120 for later removal and replacement with other active and/or insulative materials. In addition, embodiments of the disclosure may include forming a first spacer layer 126 on outer surfaces of insulative liner 122 and/or polycrystalline semiconductor 124. First spacer layer 126 can be provided as one or more bodies of insulating material formed on the upper surface of a material, e.g., by deposition, thermal growth, etc., to electrically and physically insulate materials subsequently formed on the coated material(s) from other components. According to an example, first spacer layer 126 may have one or more oxide insulator materials (e.g., $SiO_2$) formed to a desired thickness. In this case, first spacer layer 126 alternatively may be formed, e.g., by oxidizing exposed outer surfaces of polycrystalline semiconductor 124 to convert its material composition into an oxide insulator (e.g., converting from poly-Si to silicon dioxide ($SiO_2$) or other semiconductor oxides).

Figure 3:
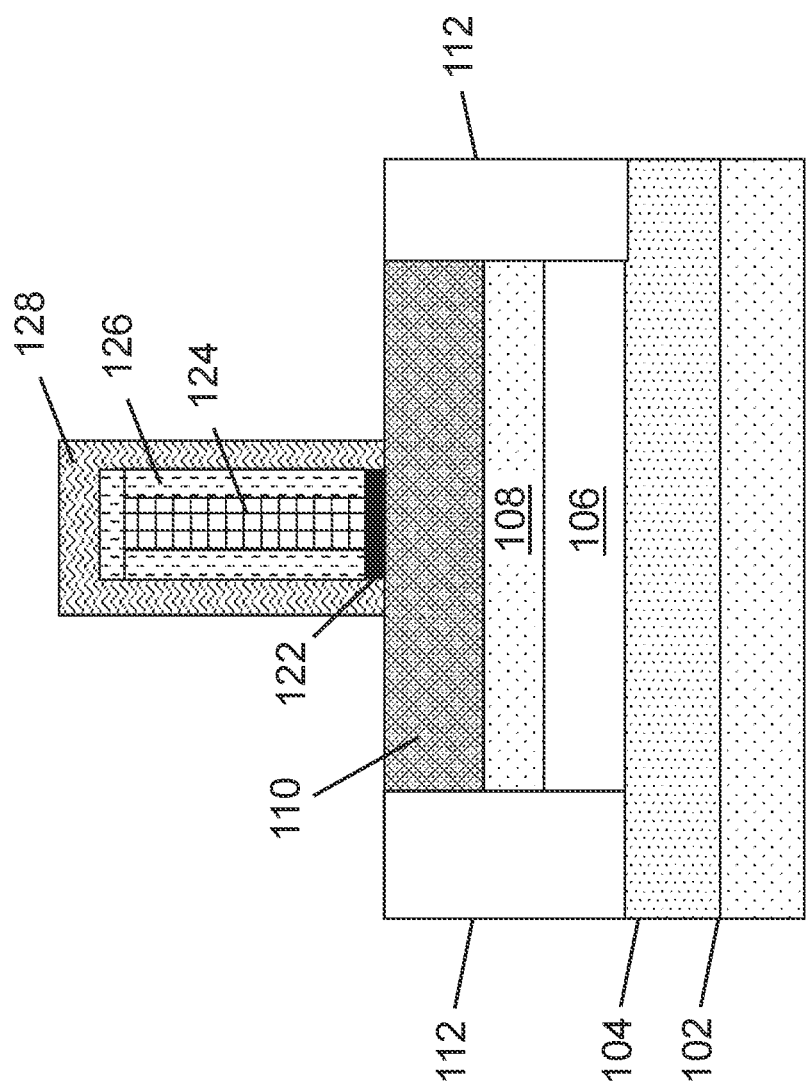
FIG. 3 provides a cross-sectional view of forming a nitride cap on the base structure according to embodiments of the disclosure.

FIG. 3 depicts forming a second spacer layer 128 on first spacer layer 126 and on a portion of doped semiconductor layer 110 thereunder. Second spacer layer 128 may be formed to approximately the same thickness as first spacer layer 126, or any other desired thickness. However, second spacer layer 128 may include a layer of insulating material that is different from first spacer layer 126. For instance, second spacer layer 128 may include one or more nitride insulators (e.g., SiN) in the case where first spacer layer 126 includes an oxide insulator. The two spacer layers may cooperate to constrain the horizontal width of any subsequent active semiconductor materials formed in place of polycrystalline semiconductor 124 in subsequent processing. Additionally as discussed elsewhere herein, either or both of spacer layers 126, 128 may be processed into inner and outer spacers for physical and electrical separation of emitter, base, and collector terminals of a lateral bipolar transistor.

Figure 4:
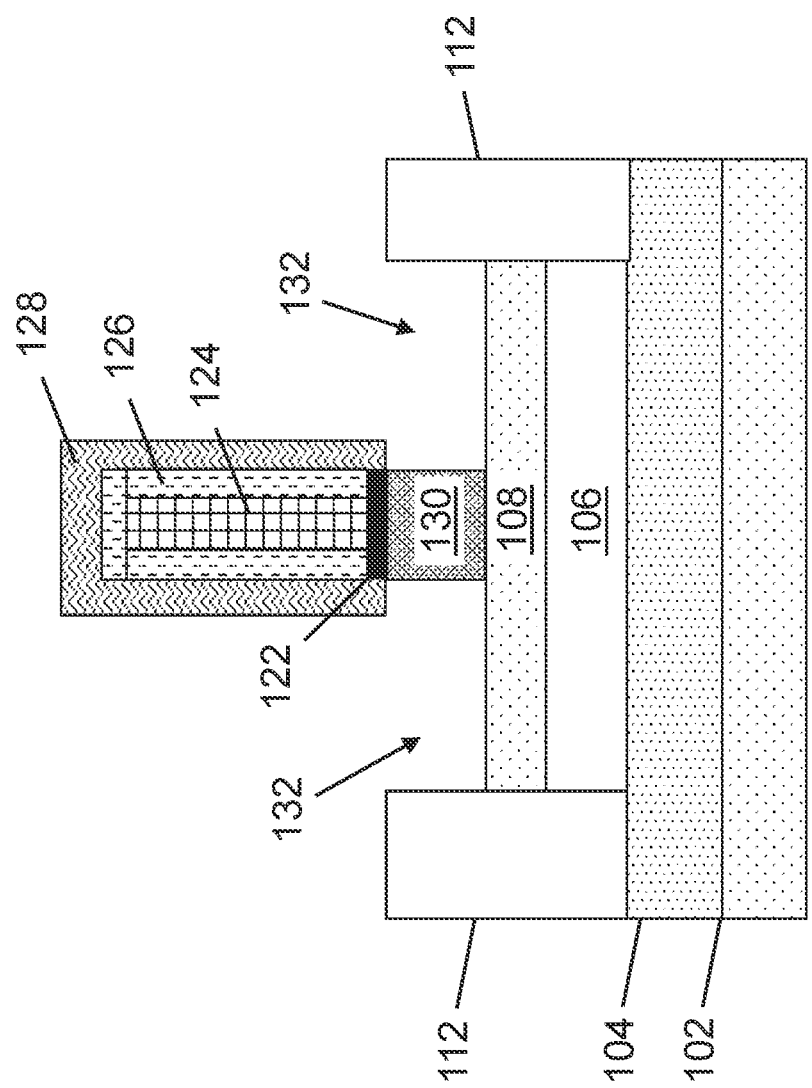
FIG. 4 provides a cross-sectional view of forming a base layer according to embodiments of the disclosure.

Referring now to FIG. 4, embodiments of the disclosure may include removing portions of doped semiconductor layer 110 (FIGS. 1-3) using spacer layers 126, 128 as a mask to form a first base layer 130 as a remaining portion of doped semiconductor layer 110. The partial removing of doped semiconductor layer 110 may include, for example, applying a predetermined amount of wet etchant(s) and/or other etching compounds selective to the composition of doped semiconductor layer 110 (e.g., SiGe). Such compounds may include, e.g., hydrofluoric acid (HF), peroxyacids, and/or other currently known or later developed wet or selective etchants. Such etchants may not remove any significant amount of semiconductor layer 108, and thus may preserve the original shape and dimensions of insulator 106 and semiconductor layer 108. The amount of etchant(s) may be controlled such that a portion of doped semiconductor layer 110 remains intact below base assembly 120 as first base layer 130. Moreover, the areas where doped semiconductor layer 110 is removed may define a set of openings 132 horizontally between first base layer 130 and TI(s) 112. Openings 132 may provide vacant space where active materials for a bipolar transistor structure may be formed in subsequent processing.

Figure 5:
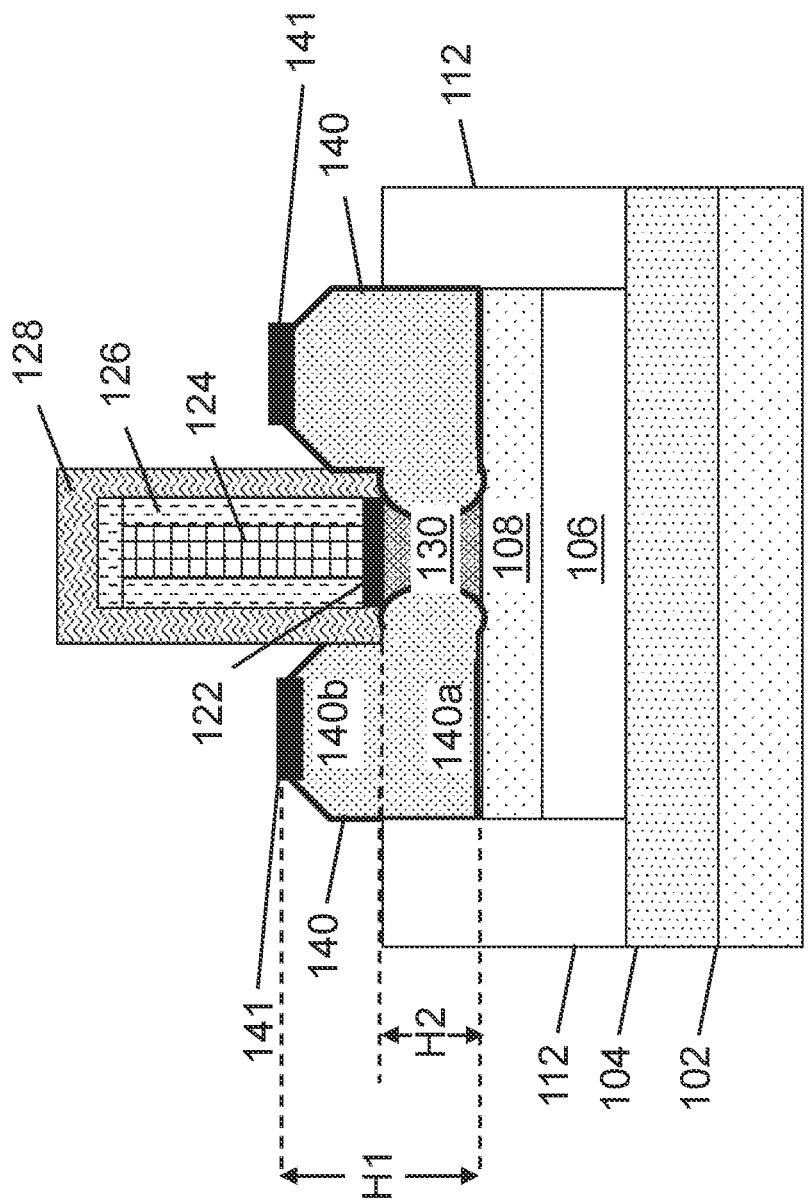
FIG. 5 provides a cross-sectional view of forming an E/C layer according to embodiments of the disclosure.

Turning to FIG. 5, further processing may include forming a set of emitter/collector (E/C) layers 140 on semiconductor layer 108 and horizontally between first base layer 130 and TI(s) 112. E/C layers 140 may define all or part of the active bipolar transistor materials for emitter and collector terminals of a bipolar transistor structure. E/C layers 140 may be formed on respective portions of semiconductor layer 108, e.g., by epitaxial growth or deposition of doped semiconductor material. E/C layers 140 may include the same material composition as first base layer 108 (e.g., doped SiGe), but with an opposite doping type (e.g., they may be doped N type when first base layer 108 is doped P type or vice versa). E/C layers 140 additionally or alternatively may include other electrically active semiconductor materials. E/C layers 140 may be formed to a desired thickness above semiconductor layer 108. In the case where E/C layers 140 are formed through epitaxial growth, they may extend to a height H1 above semiconductor layer 108 that is greater than a height H2 of first base layer 130 above semiconductor layer 108. In this case, spacer layers 126, 128 may horizontally separate each E/C layer 140 from polycrystalline semiconductor 124 of base assembly 120.

The forming of E/C layers 140, in some cases, may cause dopants from the newly formed E/C layers 140 to migrate into first base layer 130. Such migration may arise in part from the higher concentration of dopants in E/C layer(s) 140 than in first base layer 130. In this case, the geometrical profile of first base layer 130 may be recessed horizontally inward to further reduce the horizontal thickness of first base layer 130 adjacent E/C layers 140. As an example, the sidewalls of first base layer 130 may take on a concave profile due to the migration of opposite type dopants into first base layer 130 (i.e., it has an hourglass shape).

FIG. 5 also depicts forming a set of E/C silicide layers 141 on E/C layer(s) 140. E/C silicide layers 151 may be formed to enhance the electrical conductivity between E/C layers 140 and conductors formed thereon. Silicide layers 141 may be formed by forming a conductive metal (e.g., cobalt, titanium, nickel, platinum, or other materials) on layers 140, annealing the metal to yield conductive silicide material(s) (e.g., cobalt silicide, titanium silicide, etc.) on upper surfaces of layers 140, and removing excess conductive metal. Silicide layers 141 may be formed to allow for stronger electrical coupling to overlying contacts.

Figure 6:
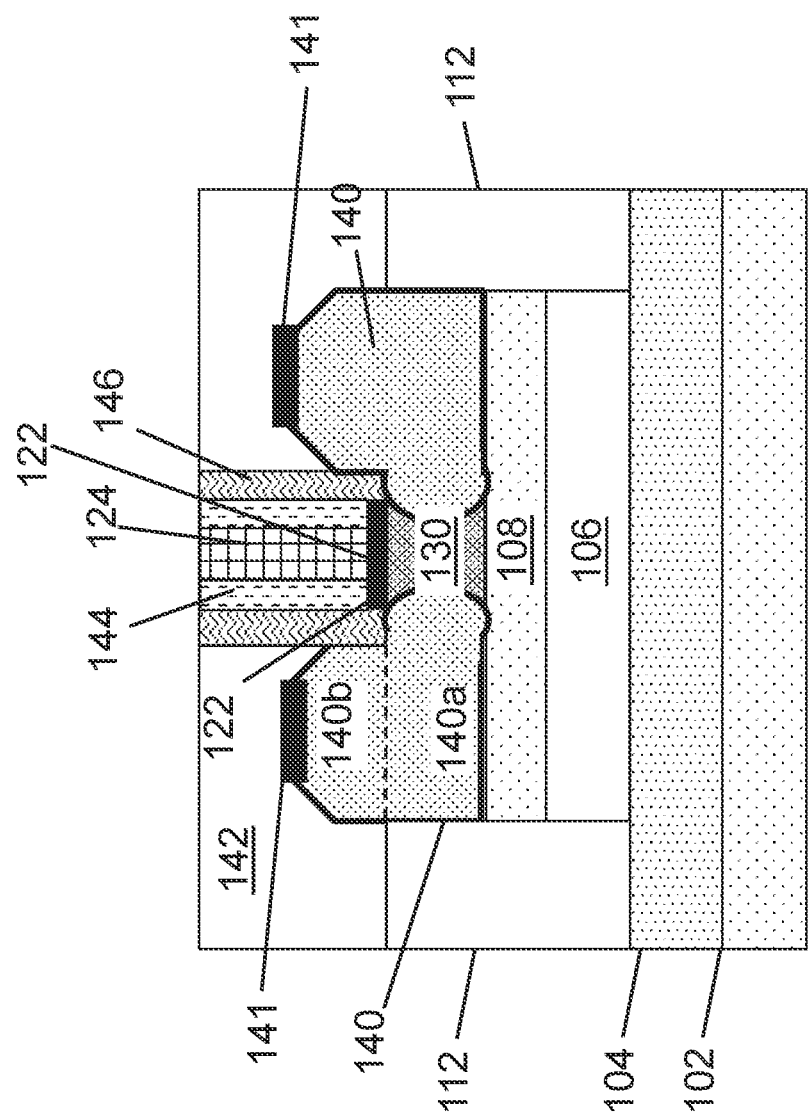
FIG. 6 provides a cross-sectional view of forming an inter level dielectric (ILD) layer according to embodiments of the disclosure.

Turning now to FIG. 6, further processing of the structure may include further modifications to base assembly 120 to form additional active materials. Here, an inter-level dielectric (ILD) layer 142 can be formed over TI(s) 112, polycrystalline semiconductor 124, E/C layer(s) 140, etc., by deposition or other techniques of forming an insulative material on a structure. Additional metallization layers (not shown) may be formed in ILD layer 142 in subsequent processing during middle-of-line and/or back-end-of-line processing. ILD layer 142 may include any currently known or later developed insulative layer, e.g., those included within insulator 106 and/or TI(s) 112. Despite ILD layer 142 possibly having a similar or identical composition to such materials, it is formed separately from other insulative material and physical boundaries and/or interfaces between ILD layer 142 and other such materials may be present in the structure.

With ILD layer 142 in place, further processing may include planarization of ILD layer 142 together with spacer layers 126, 128 (FIGS. 2-5) to form an inner spacer 144 adjacent polycrystalline semiconductor 124 and an outer spacer 146 adjacent inner spacer 146. The planarizing of spacer layers 126, 128 and ILD layer 142 may be implemented, e.g., using chemical mechanical planarization (CMP) or other processes operable to planarize the upper surface of a structure such that it has a single horizontal upper surface. Any remaining portion(s) of first spacer layer 126 may define inner spacer 144, and thus inner spacer 144 may have the same composition as first spacer layer 126, described elsewhere herein. Any remaining portion(s) of second spacer layer 128 may define outer spacer 146, and thus may have the same composition as second spacer layer 128. In an example, inner spacer 144 may include an oxide insulator while outer spacer 146 may include a nitride insulator.

Figure 7:
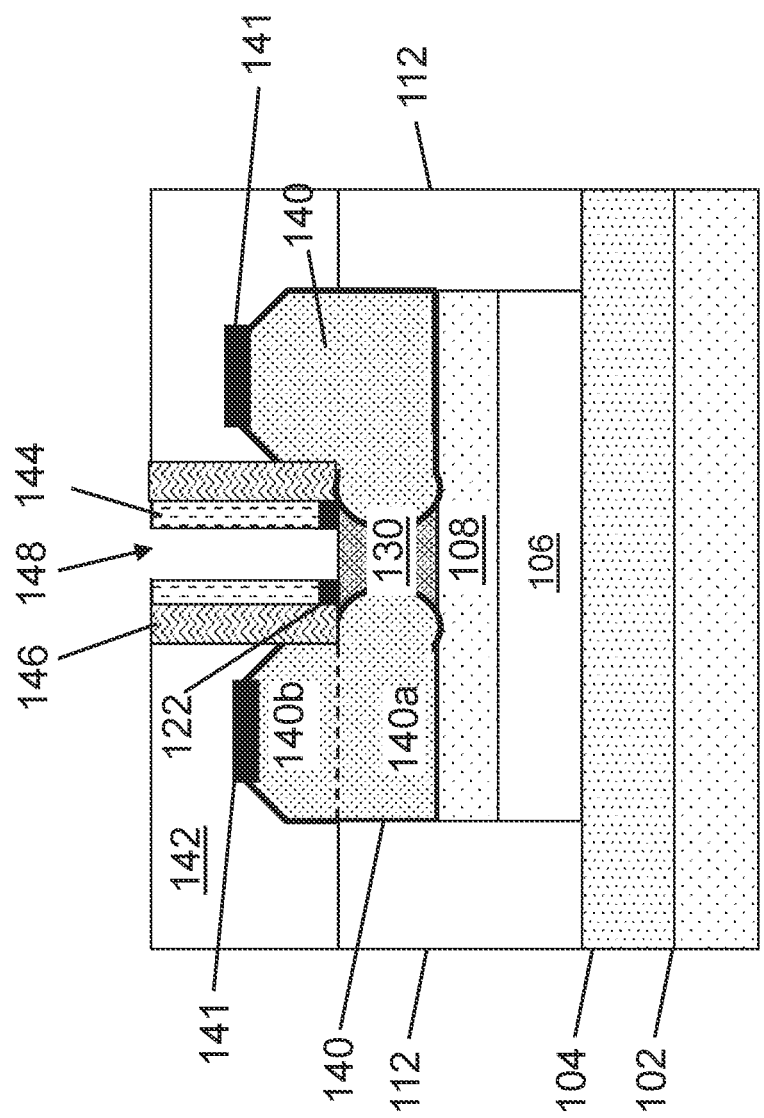
FIG. 7 provides a cross-sectional view of forming an opening over the base layer according to embodiments of the disclosure.

Turning to FIG. 7, subsequent processing may replace polycrystalline semiconductor 124 (FIGS. 2-6) with various active material(s) for the base terminal of an eventual lateral bipolar transistor. Here, polycrystalline semiconductor 124 may be removed (e.g., by selective etching through wet etchants and/or similar materials) without affecting ILD layer 142 or spacers 144, 146 to form an opening 148 over first base layer 130. Opening 148 may be adjacent, and in some cases may be horizontally between, respective layer(s) of inner spacer 144. Opening 148 may have substantially the same horizontal width as polycrystalline semiconductor 124, and thus opening 148 may define the size and shape of replacement materials formed therein. The forming of opening 148, in addition, may remove a portion of insulative liner 122 to expose first base layer 130.

Figure 8:
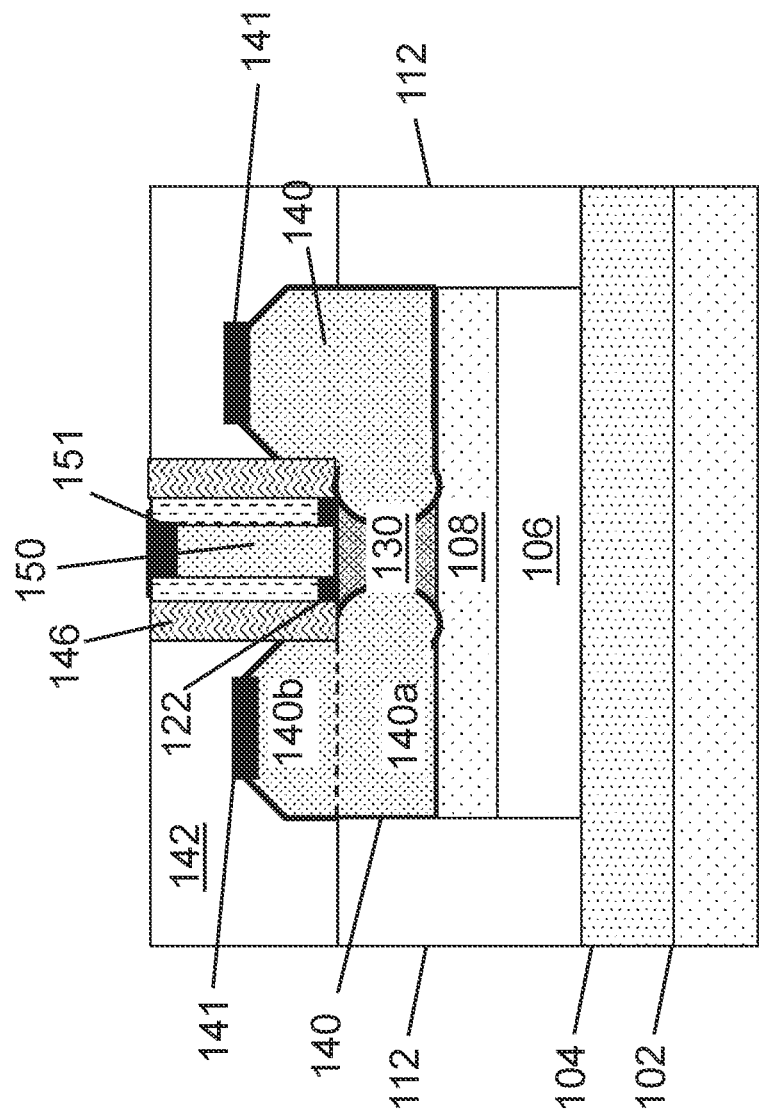
FIG. 8 provides a cross-sectional view of forming an extrinsic base according to embodiments of the disclosure.

FIG. 8 depicts forming additional doped semiconductor material on first base layer 130 to define remaining portions of a base terminal. A second base layer 150 may be formed by deposition and/or epitaxial growth of silicon germanium (SiGe) and/or other semiconductor materials within opening 148 (FIG. 7). Second base layer 150 optionally may have the same doping type as first base layer 130 (e.g., both may be doped P type). Second base layer 150 can be formed for example by selectively growing silicon material above first base layer 130. Second base layer 150 may have a higher concentration of dopants than first base layer 130, or semiconductor layer 108 (which is electrically inactive). Second base layer 150, in addition, may have a width that is approximately equal to a width of the previously removed polycrystalline semiconductor 124 (FIGS. 2-6), and in some cases may have a smaller horizontal width than first base layer 130.

In the eventual lateral bipolar transistor structure, first base layer 130 may define a lightly doped intrinsic base region, while second base layer 150 may define a highly doped extrinsic base region of the transistor. In some cases, first base layer 130 may be adjacent only E/C layer(s) 140 and second base layer 150 may be adjacent only inner spacer(s) 144. The higher dopant concentration in second base layer 150 may increase electrical conductivity between second base layer 150 and any overlying contacts for controlling the flow of current through the lateral bipolar transistor structure. Additionally, a base silicide layer 151 may be formed on second base layer 150 in substantially the same manner as E/C silicide layers 141, also shown in FIG. 8 and discussed elsewhere herein.

Figure 9:
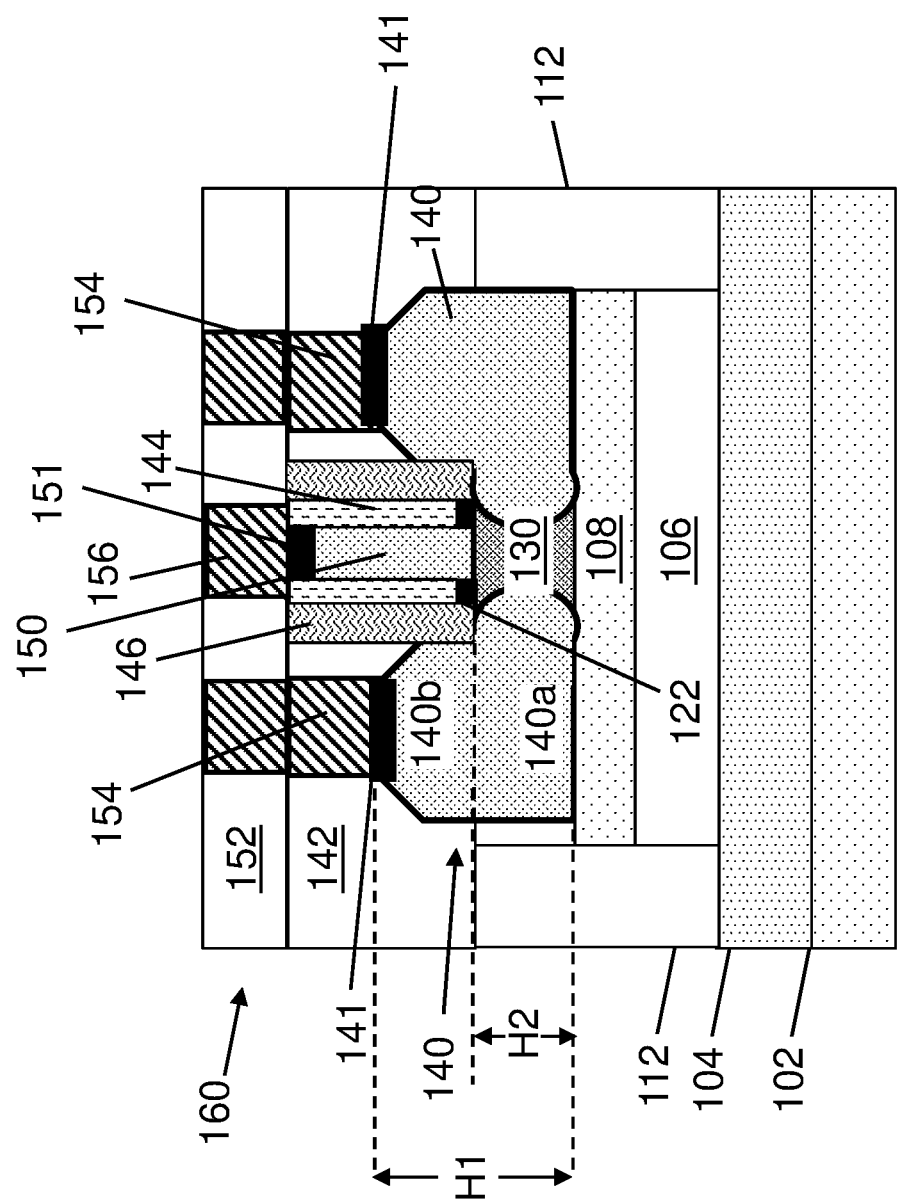
FIG. 9 provides a cross-sectional view of forming contacts to a lateral bipolar transistor structure according to embodiments of the disclosure.

Referring to FIG. 9, continued processing may include forming an additional ILD layer 152 on ILD layer 142 to electrically insulate the previously discussed active semiconductor material from overlying structures and/or wires. In some cases, additional ILD layer 152 may be contiguous with ILD layer 142 such that no physical interface is visible between layers 142, 152. To electrically couple E/C layers 140 to overlying layers and/or structures, a set of E/C contacts 154 may be formed to E/C layers 140 (e.g., via E/C silicide layers 141) and within ILD layer(s) 142, 152. Similarly, a set of base contacts 156 may be formed on second base layer 150 (e.g., via base silicide layer 141) and within ILD layer(s) 142, 152.

Embodiments of the disclosure provide a lateral bipolar transistor structure 160 in which second base layer 150 is on first base layer 130 and adjacent inner and outer spacers 146, 146. Forming second base layer 150 adjacent and/or between inner spacers 144, with outer spacer(s) 146 being adjacent inner spacer(s) 144 will limit the horizontal width of second base layer 150, i.e., it can be no wider than first base layer 130 thereunder. Such reductions in size may contribute to speed and reliability of bipolar transistor structure 160, while also allowing it to be formed within a smaller surface area than conventional bipolar transistor structures. In addition, E/C layer(s) 140 may be located partially below outer spacer 146 or even portions of inner spacer 144 at their interface with first base layer 130. In this configuration, second base layer 150 still may have a greater dopant concentration than first base layer 130 and thus an extrinsic base region and an intrinsic base region may be defined within second base layer 150 and first base layer 130, respectively. The position and size of inner spacer 144 and outer spacer 146, in addition, may prevent electrical pathways from forming directly between E/C layer(s) 140 and second base layer 150.

In lateral bipolar transistor structure 160, E/C layer(s) 140 may include a lower portion 140a that is adjacent first base layer 130, and an upper portion 140b that is adjacent outer spacer 146. Due to the presence of upper portion 140b, E/C layer 140 may have a height H1 above semiconductor layer 108 that is greater than a height H2 of first base layer 130 above semiconductor layer 108. Thus, E/C layer 140 may be taller than first base layer 130 even if height H1 of E/C layer 140 above semiconductor layer 108 is not greater than the combined height of first and second base layers 130, 150 above semiconductor layer 108. In some areas of upper portion 140b, inner and outer spacers 146, 146 may be the only material that is horizontally between E/C layer 140 and second base layer 150. To provide this configuration, inner spacer 144 and/or outer spacer 146 may have a substantially uniform horizontal width between second base layer 150 and outer spacer 146 (i.e., they may be substantially rectangular).

Figure 10:
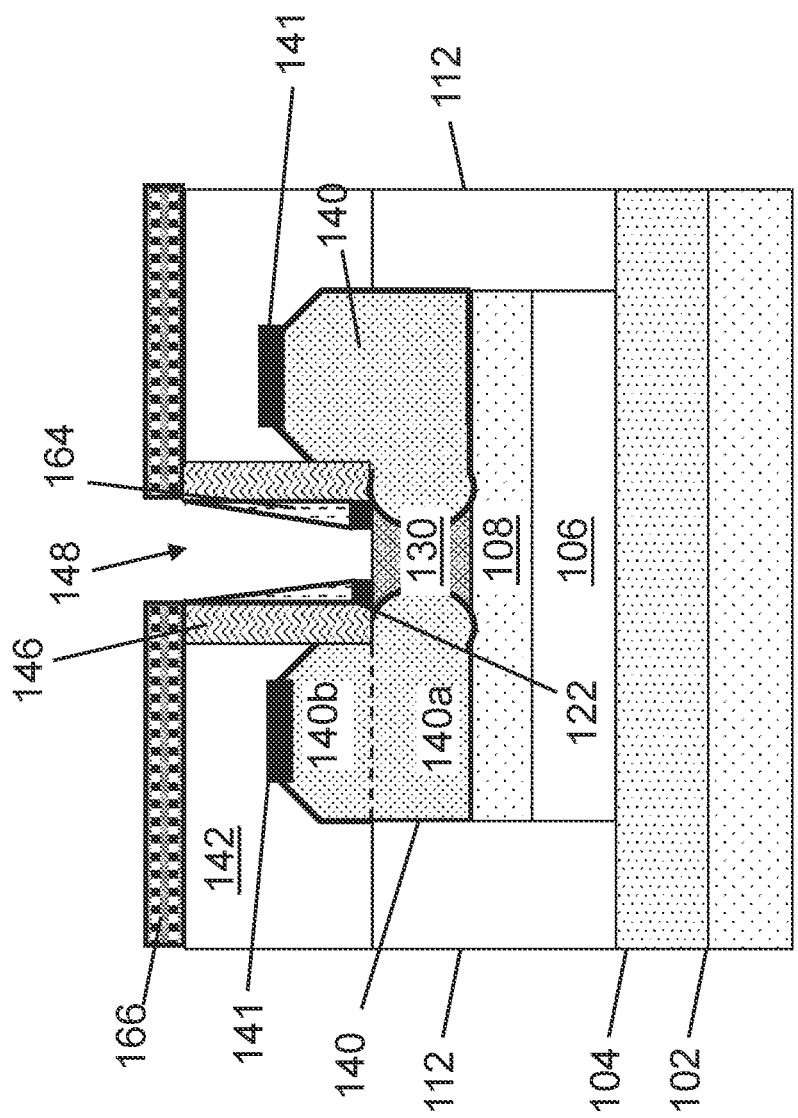
FIG. 10 provides a cross-sectional view of forming inner spacers with vertically tapered sidewalls according to embodiments of the disclosure.

Turning to FIG. 10 and with reference to FIG. 7, further methodologies according to the disclosure may produce other spacers with non-rectangular shapes, non-uniform widths, and or other profiles, e.g., that are different from outer spacer 146 (FIG. 8). For example, as shown in FIG. 10, embodiments of the disclosure may include removing portions of inner spacer 144 (FIG. 7) to form a chamfered inner spacer 164 within opening 148. To remove portions of inner spacer 144, a mask 166 may be formed on ILD layer 142 and outer spacer 146 and/or inner spacer 144 may be contacted with etchants selective to its composition (e.g., oxide selective etchants). When such etchants and/or other removal techniques are applied from above inner spacer 144, less spacer material will be removed in lower portions of opening 148 than upper portions thereof. The resulting chamfered inner spacer 164 may be thinnest at its upper surface and thickest at its lower surface, such that chamfered inner spacer 164 includes a vertically tapered sidewall adjacent opening 148 and a non-tapered sidewall adjacent outer spacer 146.

Figure 11:
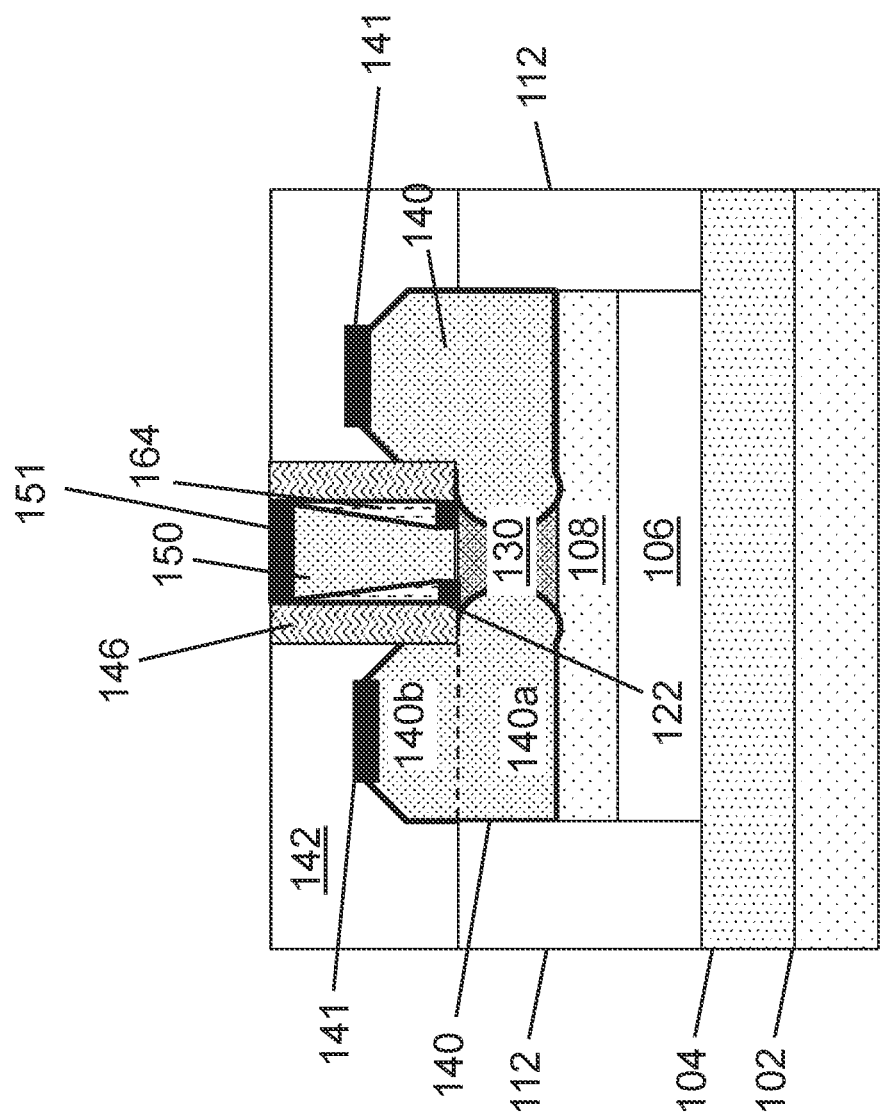
FIG. 11 provides a cross-sectional view of forming an extrinsic base adjacent the vertically tapered sidewalls according to embodiments of the disclosure.
Figure 12:
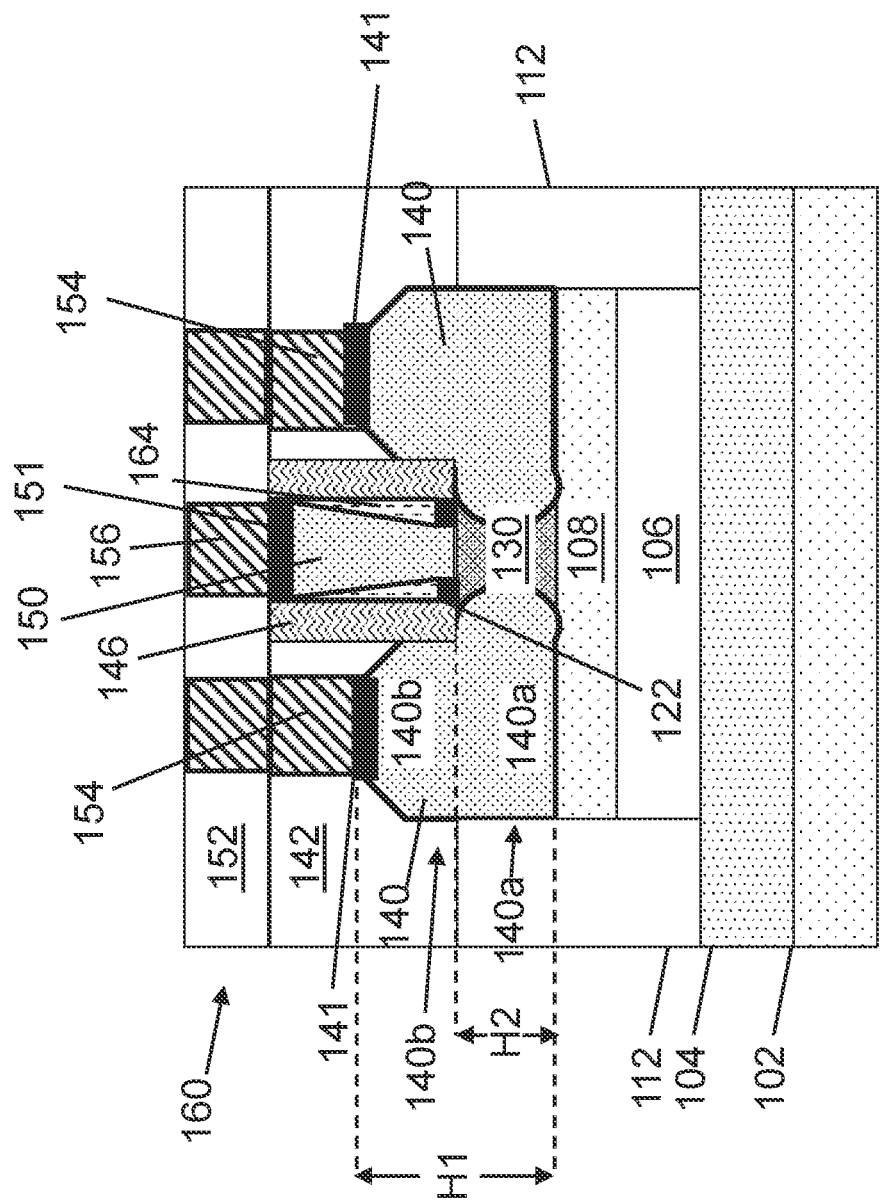
FIG. 12 provides a cross-sectional view of a lateral bipolar transistor structure and inner spacers with vertically tapered sidewalls according to embodiments of the disclosure.

Proceeding to FIGS. 11 and 12, additional processing is illustrated in cross-sectional view. FIG. 11 depicts forming second spacer layer 150 and base silicide 151, and FIG. 12 depicts forming remaining portions of lateral bipolar transistor 160. At this stage, mask 166 (FIG. 10) may be removed and processing may continue in substantially the same manner as other embodiments despite the modifying of inner spacer 144 into chamfered inner spacer 164. In this case, second base layer 150 may be horizontally widest at its upper surface beneath base silicide 151 and horizontally thinnest at its interface with first base layer 130. That is, the width of second base layer 150 may gradually increase with respect to height above first base layer 130. In lateral bipolar transistor structure 160, chamfered inner spacer 164 may also substantially retain a vertically tapered sidewall adjacent second base layer 150 and a non-tapered sidewall adjacent outer spacer 164. Among other things, using chamfered inner spacer 164 may allow stronger electrical conductivity between base contact and second base layer 150 through base silicide 151, while retaining the advantageously reduced width at the interface between second base layer 150 and first base layer 130.

Figure 13:
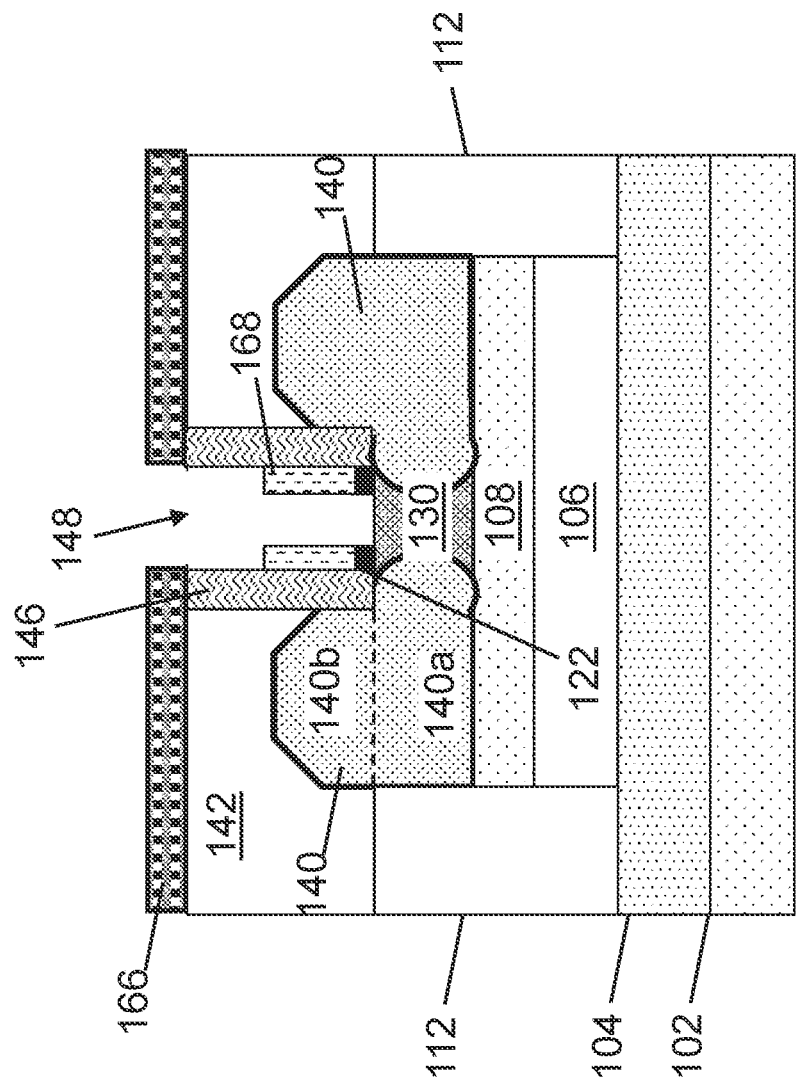
FIG. 13 provides a cross-sectional view of recessing a set of inner spacers according to embodiments of the disclosure.

Turning to FIG. 13, and with reference to FIG. 7, further implementations of the disclosure may include recessing of inner spacer 144 to form a recessed inner spacer 168 within opening 148. As with other operations discussed herein, inner spacer 144 may be selectively processed (e.g., with mask 166 in place), and portions of inner spacer 144 may be removed such that only a portion of inner spacer 144 remains on first base layer 130 as recessed inner spacer 168. Recessed inner spacer 168 may be formed, e.g., by downward etching (e.g., reactive ion etching (RIE)) of inner spacer 144 material to expose the adjacent sidewall(s) of outer spacer 146 in opening 148. Once recessed inner spacer 168 is formed, upper portions of opening 148 may be wider adjacent outer spacer(s) 146 and lower portions of opening 148 may be thinner adjacent recessed inner spacer(s) 168. In this case, opening 148 may be substantially T-shaped. Although recessed inner spacer(s) 168 are shown by example to be substantially rectangular, recessed inner spacer(s) 168 may feature vertically tapered sidewalls and/or characteristics of other spacer configurations described herein.

Figure 14:
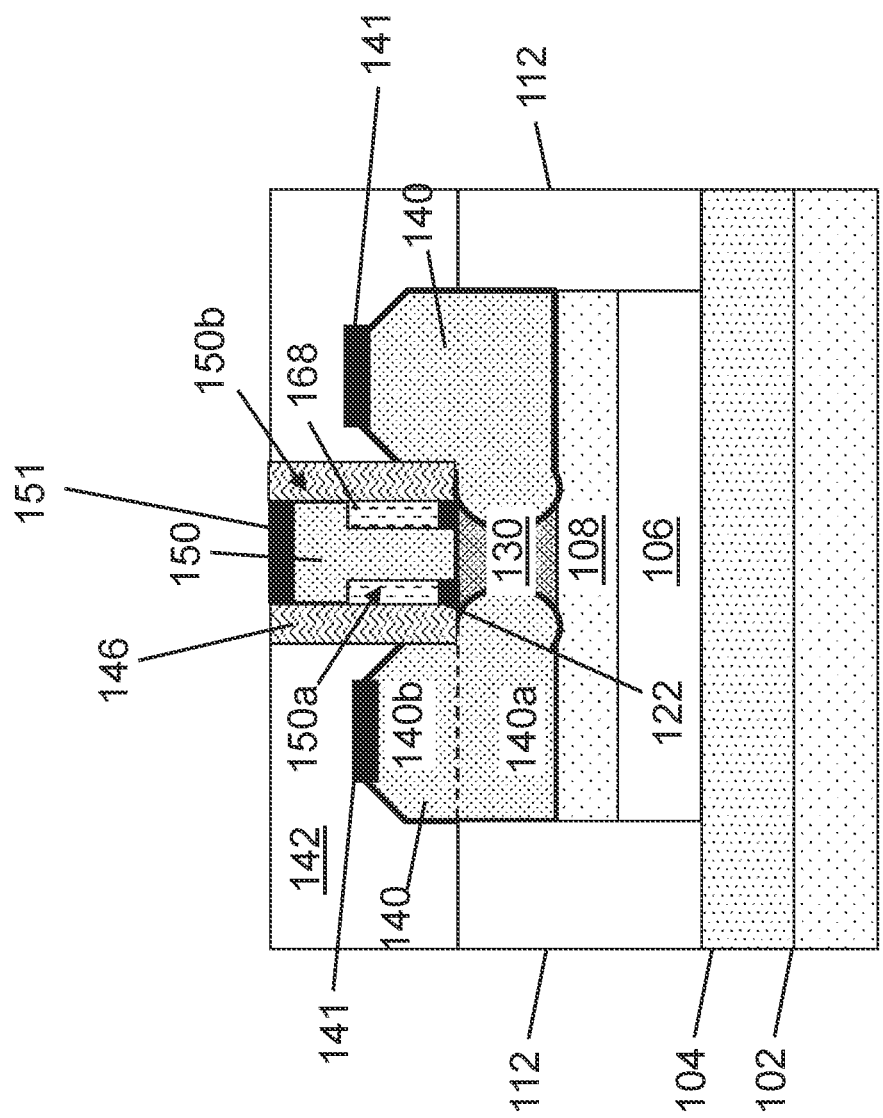
FIG. 14 provides a cross-sectional view of forming a T-shaped extrinsic base according to embodiments of the disclosure.
Figure 15:
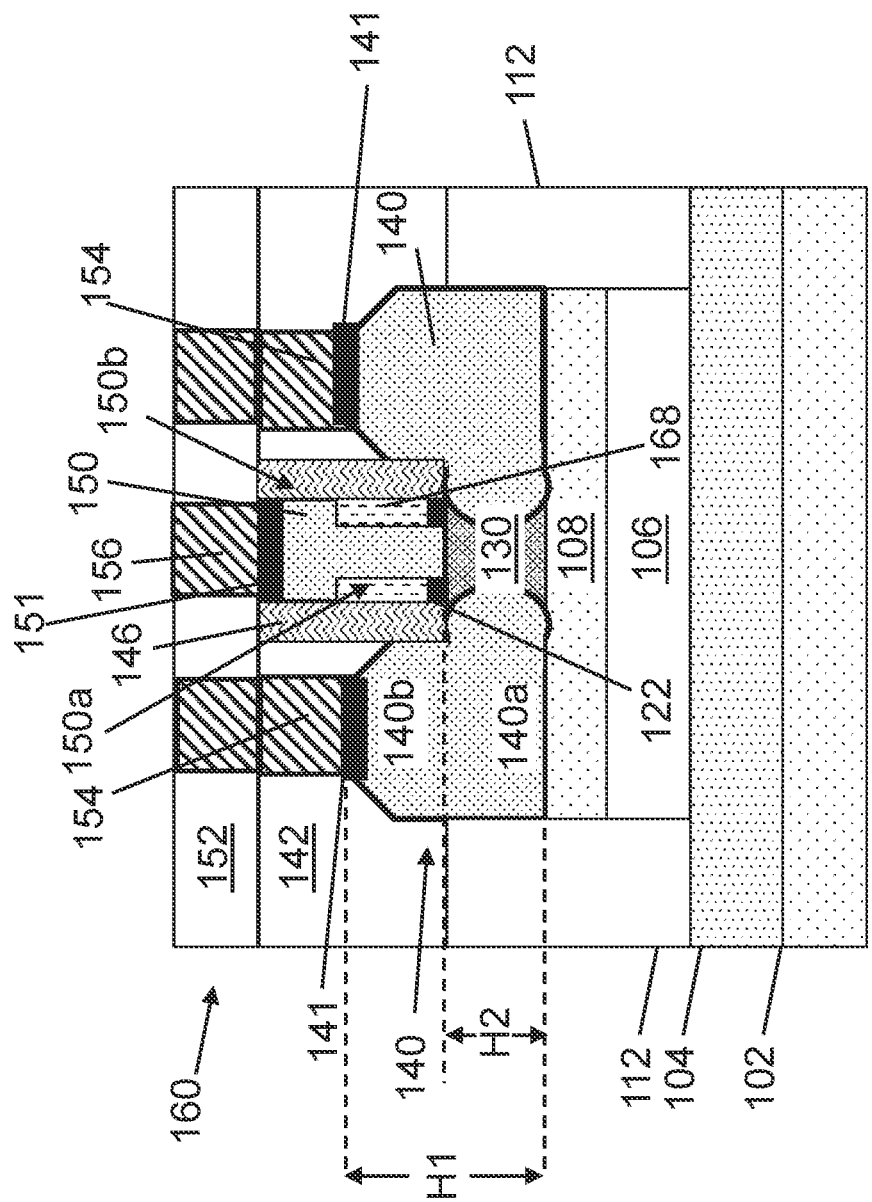
FIG. 15 provides a cross-sectional view of a lateral bipolar transistor structure with a T-shaped extrinsic base according to embodiments of the disclosure.

Proceeding to FIGS. 14 and 15, additional processing is illustrated in cross-sectional view. FIG. 14 depicts forming second spacer layer 150 and base silicide 151, and FIG. 15 depicts forming remaining portions of lateral bipolar transistor 160. Further processing may be implemented after recessed inner spacer(s) 168 are formed. Mask 166 (FIG. 10) may be removed from ILD layer 142 and the remaining portions of lateral bipolar transistor structure 160 may be formed substantially as discussed herein. Due to the forming of recessed inner spacer 168, second base layer 150 may include a lower portion 150a that is adjacent recessed inner spacer 168 and an upper portion 150b that is adjacent outer spacer 146 and over recessed inner spacer 168. Upper portion 150b of second base layer 150 may be horizontally wider than lower portion 150b of second base layer 150 due to the smaller height of recessed inner spacer 168 above first base layer 150. That is, the width of second base layer 150 may be piecewise defined (i.e., it increases at a predetermined point from a lower width to a greater width). Second base layer 150 in this case may be substantially T-shaped. However, in embodiments where recessed inner spacer 168 includes tapered sidewalls, the horizontal width of second base layer 150 may increase gradually with respect to height before having a greater horizontal width over recessed inner spacer 168. As with other implementations with chamfered inner spacer 164 (FIGS. 10-12), the use of recessed inner spacer 168 may allow stronger electrical conductivity between base contact and second base layer 150 through base silicide 151, while retaining the advantageously reduced width at the interface between second base layer 150 and first base layer 130.

Embodiments of the disclosure may provide several technical advantages. Lateral bipolar transistor structure 160 includes second base layer 150 with a horizontal width, that, advantageously, is no wider than first base layer 130 and in which lower portion 140a of E/C layer(s) 140 may extend below outer and/or inner spacers 146, 144. The use of multiple spacers 144, 146 may constrain the size of second base layer 150 while also, optionally, allowing a wider coupling to base silicide 151 and simultaneously a narrower physical interface with first base layer 130. Embodiments of the disclosure may allow inner and outer spacers 146, 146 to be the sole insulative material between second base layer 150 and E/C layer(s) 140, thus allowing E/C layers 140 to extend further above underlying materials such as semiconductor layer 108. These and other features of the disclosure may provide improvements to gain and frequency of operation, e.g., due to increased electron mobility. Embodiments of the disclosure can be implemented using existing CMOS processing techniques and/or masking materials.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A lateral bipolar transistor structure comprising:
    an emitter/collector (E/C) layer over an insulator, the E/C layer having a first doping type;
    a first base layer on the insulator and adjacent the E/C layer, the first base layer having a concave sidewall adjacent the E/C layer, wherein the first base layer has a second doping type opposite the first doping type;
    a second base layer on the first base layer and having the second doping type, wherein a dopant concentration of the second base layer is greater than a dopant concentration of the first base layer;
    an inner spacer on the E/C layer and adjacent the second base layer; and
    an outer spacer on the E/C layer and adjacent the inner spacer.

2. The lateral bipolar transistor structure of claim 1, wherein the inner spacer includes a vertically tapered sidewall adjacent the second base layer and a non-tapered sidewall adjacent the outer spacer.

3. The lateral bipolar transistor structure of claim 1, wherein the second base layer includes:
    a lower portion having a first horizontal width, and
    an upper portion having a second horizontal width greater than the first horizontal width, wherein the upper portion is on the inner spacer and adjacent the outer spacer.

4. The lateral bipolar transistor structure of claim 3, wherein a horizontal width of the first base layer relative to the inner spacer is less than a horizontal width of the upper portion of the second base layer relative to the inner spacer.

5. The lateral bipolar transistor structure of claim 1, wherein the E/C layer includes a lower portion adjacent the first base layer and an upper portion adjacent the outer spacer.

6. The lateral bipolar transistor structure of claim 1, wherein the inner spacer includes a substantially uniform horizontal width between the second base layer and the outer spacer.

7. The lateral bipolar transistor structure of claim 1, wherein the inner spacer includes an oxide insulator, and the outer spacer includes a nitride insulator.

8. A lateral bipolar transistor structure comprising:
    an emitter/collector (E/C) layer over an insulator, the E/C layer having a first doping type;
    a first base layer on the insulator and adjacent the E/C layer, wherein the first base layer has a second doping type opposite the first doping type;
    a second base layer on the first base layer and having the second doping type, wherein a dopant concentration of the second base layer is greater than a dopant concentration of the first base layer, the second base layer including:
        a lower portion having a first horizontal width over the first base layer, and
        an upper portion having a second horizontal width over the first base layer greater than the first horizontal width;
    an inner spacer on the E/C layer and adjacent the second base layer; and
    an outer spacer on the E/C layer and adjacent the inner spacer.

9. The lateral bipolar transistor structure of claim 8, wherein the inner spacer includes a vertically tapered sidewall adjacent the second base layer and a non-tapered sidewall adjacent the outer spacer.

10. The lateral bipolar transistor structure of claim 8, wherein a horizontal width of the first base layer is less than a horizontal width of the upper portion of the second base layer.

11. The lateral bipolar transistor structure of claim 8, wherein the upper portion includes a lower surface on an upper surface of the inner spacer, and a sidewall adjacent the outer spacer.

12. The lateral bipolar transistor structure of claim 8, wherein the E/C layer includes a lower portion adjacent the first base layer and an upper portion adjacent the outer spacer.

13. The lateral bipolar transistor structure of claim 8, wherein the second base layer is substantially T-shaped.

14. The lateral bipolar transistor structure of claim 8, wherein the inner spacer includes an oxide insulator, and the outer spacer includes a nitride insulator.

15. A method of forming bipolar transistor structure, the method comprising:
    forming an emitter/collector (E/C) layer over an insulator, the E/C layer having a first doping type;
    forming a first base layer on the insulator and adjacent the E/C layer, the first base layer having a concave sidewall adjacent the E/C layer, wherein the first base layer has a second doping type opposite the first doping type;
    forming a second base layer on the first base layer and having the second doping type, wherein a dopant concentration of the second base layer is greater than a dopant concentration of the first base layer;
    forming an inner spacer on the E/C layer and adjacent the second base layer; and
    forming an outer spacer on the E/C layer and adjacent the inner spacer.

16. The method of claim 15, wherein forming the inner spacer includes forming a vertically tapered sidewall of the inner spacer adjacent the second base layer and a non-tapered sidewall of the inner spacer adjacent the outer spacer.

17. The method of claim 15, wherein forming the second base layer includes:
    forming a lower portion of the inner spacer on the first base layer having a first horizontal width, and
    forming an upper portion of the inner spacer on the lower portion, the inner spacer, and adjacent the outer spacer, the upper portion having a second horizontal width greater than the first horizontal width.

18. The method of claim 15, wherein forming the E/C layer includes:
    forming a lower portion of the E/C layer adjacent the first base layer; and
    forming an upper portion of the E/C layer adjacent the outer spacer.

19. The method of claim 15, wherein the inner spacer includes a substantially uniform horizontal width between the second base layer and the outer spacer.

20. The method of claim 15, wherein forming the inner spacer includes forming an oxide insulator, and wherein forming the outer spacer includes forming a nitride insulator.

* * * * *